United States Patent
Gage et al.

(10) Patent No.: US 8,391,107 B2
(45) Date of Patent: Mar. 5, 2013

(54) SLIDER FOR HEAT ASSISTED MAGNETIC RECORDING INCLUDING A PHOTO DETECTOR FOR MONITORING LASER POWER

(75) Inventors: Edward Charles Gage, Lakeville, MN (US); Lifu Zhou, Eden Prairie, MN (US); Michael Allen Seigler, Eden Prairie, MN (US); William Albert Challener, Glenville, NY (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/052,635

(22) Filed: Mar. 21, 2011

(65) Prior Publication Data

US 2011/0228652 A1  Sep. 22, 2011

Related U.S. Application Data

(60) Provisional application No. 61/315,713, filed on Mar. 19, 2010.

(51) Int. Cl.
*G11B 7/00* (2006.01)
*G11B 5/02* (2006.01)

(52) U.S. Cl. ....................................... 369/13.26; 360/59

(58) Field of Classification Search ............... 369/13.26, 369/47.5, 47.51, 47.52, 53.26, 116, 13.33, 369/13.13, 13.32, 13.24; 360/59, 125.31
See application file for complete search history.

(56) References Cited

U.S. PATENT DOCUMENTS

| | | | |
|---|---|---|---|
| 6,611,487 B2 | 8/2003 | Shimano et al. | |
| 6,671,248 B2 | 12/2003 | Miyabata et al. | |
| 6,944,112 B2 * | 9/2005 | Challener | 369/112.27 |
| 7,057,999 B2 | 6/2006 | Cheong et al. | |
| 7,077,564 B2 | 7/2006 | Schloss et al. | |
| 7,538,978 B2 * | 5/2009 | Sato et al. | 360/128 |
| 7,589,928 B2 | 9/2009 | Roy et al. | |
| 7,898,759 B2 * | 3/2011 | Matsumoto et al. | 360/59 |
| 8,243,561 B2 * | 8/2012 | Matsumoto | 369/13.33 |
| 2001/0030928 A1 | 10/2001 | Cheong et al. | |
| 2006/0221483 A1 * | 10/2006 | Kamimura et al. | 360/59 |
| 2007/0159718 A1 * | 7/2007 | Kim et al. | 360/125 |
| 2008/0055784 A1 * | 3/2008 | Shimazawa et al. | 360/313 |
| 2008/0080039 A1 * | 4/2008 | Hongo et al. | 359/237 |
| 2008/0204916 A1 * | 8/2008 | Matsumoto et al. | 360/59 |
| 2009/0225464 A1 | 9/2009 | Juang et al. | |
| 2009/0310459 A1 | 12/2009 | Gage et al. | |
| 2011/0122737 A1 | 5/2011 | Shimazawa et al. | |
| 2011/0228653 A1 | 9/2011 | Shimazawa et al. | |
| 2012/0008470 A1 | 1/2012 | Shimazawa et al. | |

* cited by examiner

*Primary Examiner* — Thomas Alunkal
(74) *Attorney, Agent, or Firm* — HolzerIPLaw, PC

(57) ABSTRACT

An apparatus includes a slider including an air bearing surface and a waveguide configured to receive light from a light source, a sensor positioned to receive a portion of light emitted by the light source prior to the light exiting the slider at the air bearing surface, and a controller controlling the light source power in response to a characteristic of the sensor.

22 Claims, 3 Drawing Sheets

SLIDER FOR HEAT ASSISTED MAGNETIC RECORDING INCLUDING A PHOTO DETECTOR FOR MONITORING LASER POWER

CROSS REFERENCE TO RELATED APPLICATION

This application claims the benefit of U.S. Provisional Patent Application Ser. No. 61/315,713, filed Mar. 19, 2010, and titled "Incorporating A Photo Detector In A HAMR Slider To Monitor Laser Power", which is hereby incorporated by reference.

BACKGROUND

In heat assisted magnetic recording, information bits are recorded on a data storage medium at elevated temperatures, and the data bit dimension can be determined by the dimensions of the heated area in the storage medium or the dimensions of an area of the storage medium that is subjected to a magnetic field. In one approach, a beam of light is condensed to a small optical spot onto the storage medium to heat a portion of the medium and reduce the magnetic coercivity of the heated portion. Data is then written to the reduced coercivity region.

One example of a recording head for use in heat assisted magnetic recording generally includes a write pole and a return pole magnetically coupled to each other through a yoke or pedestal, and a waveguide for focusing light onto the storage medium. The waveguide is positioned between the write pole and the return pole. Light from a laser is coupled into the waveguide and transmitted through the waveguide to produce a tightly focused laser spot on the storage media. The power in this spot determines the width of the recorded track and the quality of the recorded transitions.

It would be desirable to have a method to measure or monitor this power once the head is assembled in a drive.

SUMMARY

In a first aspect, the disclosure provides an apparatus including a slider having an air bearing surface and a waveguide configured to receive light from a light source, a sensor positioned to receive a portion of light emitted by the light source prior to the light exiting the slider at the air bearing surface, and a controller controlling the light source power in response to a characteristic of the sensor.

These and other features and advantages which characterize the various embodiments of the present disclosure can be understood in view of the following detailed discussion and the accompanying drawings.

DETAILED DESCRIPTION

In one aspect of the disclosure, a light sensor is mounted in or on a slider in a heat assisted magnetic recording system. Light is transmitted from a light source, such as a laser, to a transducer in a recording head that concentrates the light to produce a small spot of light on a surface of a recording medium. A small portion of the light is used to induce a photoconductive or photovoltaic change in a sensor, wherein the photoconductive or photovoltaic change is representative of the laser power. By sensing a change in current or voltage from when the laser is switched from off to on, a signal can be detected during operation of the recording head and used to set the laser power in response to laser aging or laser thermal effects. The sensor is positioned to sense a portion of the light in the slider, prior to the light being delivered to the recording medium.

Figure 1:
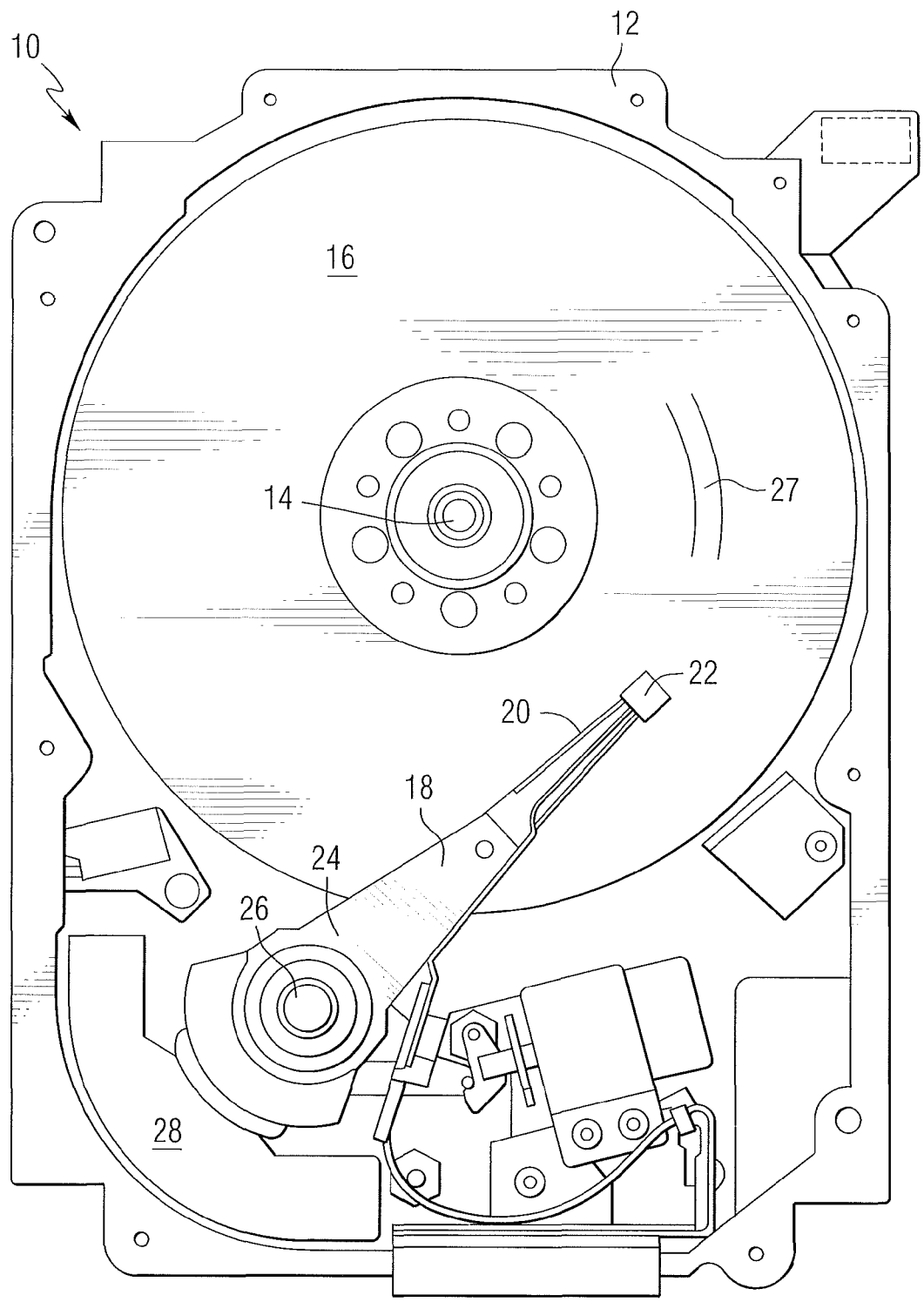
FIG. 1 is a pictorial representation of a data storage device in the form of a disc drive that can include an apparatus for monitoring or measuring light power in accordance with an aspect of this disclosure.

FIG. 1 is a pictorial representation of a data storage device in the form of a disc drive 10 that can include an apparatus for monitoring or measuring light power in accordance with an aspect of the disclosure. The disc drive 10 includes a housing 12 (with the upper portion removed and the lower portion visible in this view) sized and configured to contain the various components of the disc drive. The disc drive 10 includes a spindle motor 14 for rotating at least one magnetic recording medium 16 within the housing. At least one aim 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired track 27 of the disc 16. The actuator motor 28 is regulated by a controller, which is not shown in this view and is well-known in the art.

For heat assisted magnetic recording (HAMR), an electromagnetic wave of, for example, visible, infrared or ultraviolet light (generally referred to as light in this description) is directed onto a surface of a recording medium to raise the temperature of a localized area of the medium to facilitate switching of the magnetization of the area. One slider design includes a laser incorporated into the slider structure. Such a laser-in-slider (LIS) design includes elements that transmit light from the laser to a device that concentrates the light into a small spot on an adjacent recording medium. The light transmission elements may include a channel waveguide and a mirror or collimator for directing a light beam to a solid immersion mirror (SIM) that focuses the light to an optical spot at or near an air bearing surface of the slider. As it is known in the art, heat assisted magnetic recording is also called thermally assisted magnetic recording (TAMR).

Figure 2:
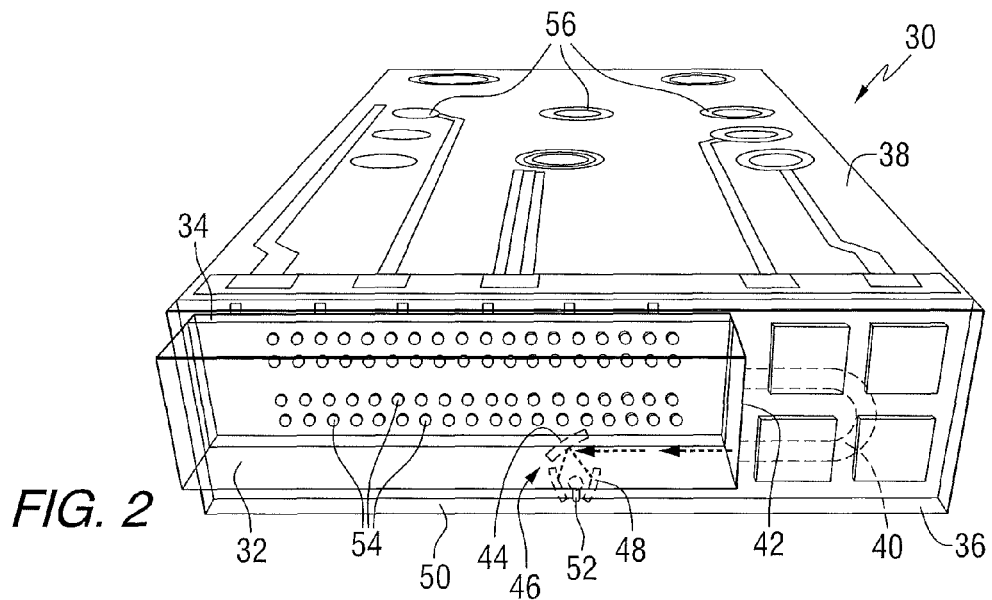
FIG. 2 is an isometric view of portions of a slider.

FIG. 2 is an isometric view of integrated laser-in-slider read/write head 30 for heat assisted magnetic recording. A laser diode 32 is mounted in an opening 34 in a trailing end 36 of a slider 38. An optical waveguide 40 is positioned in the slider adjacent to the trailing end. Light produced by the laser diode exits the output facet 42, is coupled into the waveguide, and reflected by a mirror 44 to a read/write head 46. The read/write head includes a solid immersion mirror 48 that concentrates the light to a small spot adjacent to an air bearing surface 50 of the slider, where the light is used to heat a portion of an adjacent storage medium. A near-field transducer (NFT) 52 can be included adjacent to the air bearing surface to further concentrate the light. The laser diode is shown as a rectangular structure which is bonded to the bottom of the opening by solder bumps 54. Top bond pads 56 that are used to electrically connect elements of the slider to a controller are shown on top of the slider. The read/write head also includes a magnetic read element (not shown in this view), which can be for example a magnetoresistive element or other type of sensor that is used to sense magnetic field from domains in a magnetic recording medium. While FIG. 2 shows a laser-in-slider embodiment, it will be understood that other embodiments are within the scope of this disclosure. Such other embodiments include a laser-on-slider wherein the laser is mounted on the slider.

Light is confined in a direct perpendicular to the plane of the figure by a planar/channel waveguide. For example in one design waveguide 40 is a channel waveguide and solid immersion mirror 48 is a planar waveguide. The waveguides can be made of a dielectric material having a high index of refraction as the waveguide core such as for example Ta2O5, SiNx, ZnS, SiOxNy, Si, SiC, cladded by one or two dielectric materials having a lower index of refraction such as Al2O3, SiO2, SiOxNy.

Figure 3:
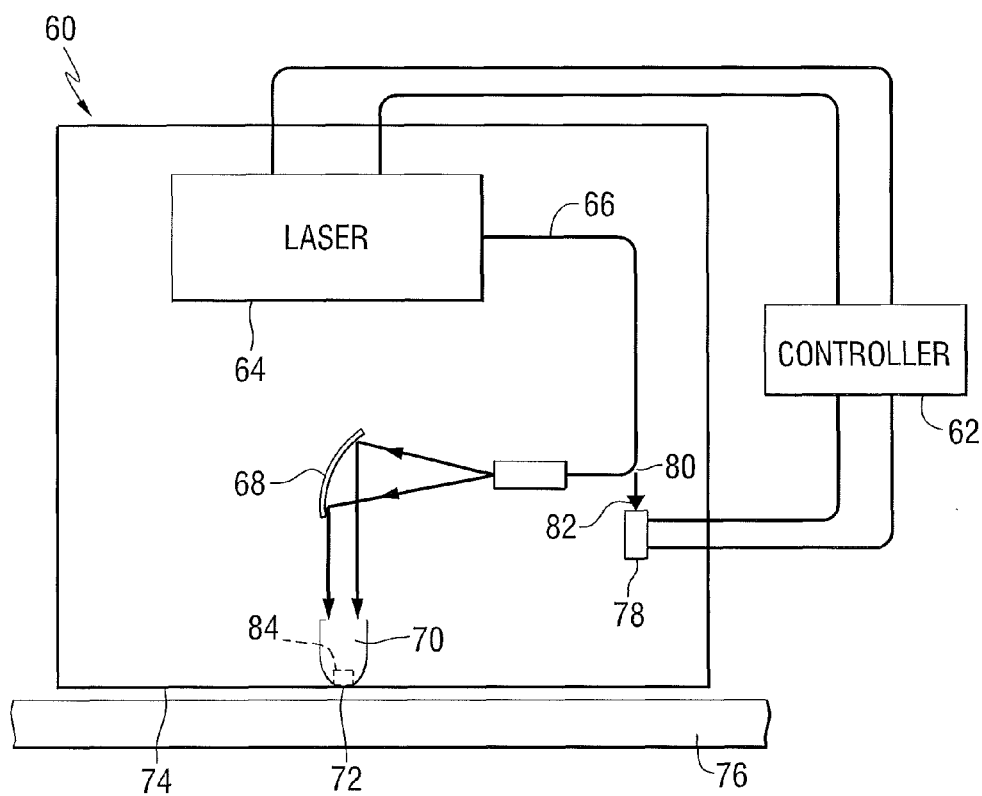
FIG. 3 is a schematic representation of portions of a slider and a controller.

In one aspect of this disclosure, a sensor can be mounted on or in the slider to detect a portion of the light produced by the laser. FIG. 3 is a schematic representation of portions of a slider 60 and a controller 62. The slider includes a laser 64 that directs light into a waveguide 66, which transmits the light to a mirror or collimator 68 that reflects the light to an optical transducer 70. The optical transducer concentrates the light to a small spot at a focal point 72, at or near the air bearing surface 74. This light is used to heat a portion of an adjacent recording medium 76. A light sensor 78 (also called a photosensor) is positioned to sense light that leaks out of the waveguide at a bend 80, as illustrated by arrow 82.

The controller is connected to the sensor and measures some characteristic or parameter of the sensor that changes with the amount of light that strikes the sensor. For example, the controller could measure a sensor voltage, resistance or current. The controller then uses the measured characteristic or parameter to control the power of the laser. Any change in optical efficiency such as laser to waveguide coupling or laser efficiency (i.e., output optical power to input electrical current) can also be detected with the sensor. Then the controller can control the laser to adjust for such changes.

The controller can include electronics that sample a characteristic of the sensor that is representative of the laser power during a data write operation. A change in laser power causes a change in a sensor characteristic such as resistance, current or voltage when the laser is switched from off to on. The change in value of the measured characteristic is then used to produce a signal representative of the laser power. The controller can compare the measured laser power to a desired laser power based on disc radii and temperature and stored in a look up table.

In addition to the photosensor, the slider can include a magnetic read sensor 84 that provides a signal representative of magnetic fields for a storage medium. The controller can receive and process the read sensor signals using known processing techniques. A lookup table of desired laser power can be constructed by optimizing recording. During the drive build and during periodic drive optimizations, test tracks can be written as a function laser power. The recording performance (e.g., figures of merit may include bit error rate, written track amplitude, written track width, channel quality monitor, and signal to noise ration) can be optimized at the lowest acceptable laser power. This laser current and sensor signal amplitude can then be stored in the lookup table. With temperature changes, a change in laser power for a given current, a change in recording performance, after a fixed amount of time, or after a number of writes, the drive could write test tracks to update the lookup table.

In some cases, the laser may be energized even during reading in order to minimize laser rise time when writing is desired. In these cases, the laser power could be sensed during reading to determine whether the laser power is not high enough to damage recorded information but still high enough to minimize laser rise time.

The specific implementation of the laser power sensor may depend on the light delivery system used in the slider. Many different HAMR light delivery designs have been previously disclosed. Such designs include a laser-in-slider or laser-on-slider assemblies and designs where the laser is separate from the slider. The sensor could be fabricated during wafer processing or attached during slider or head gimbal assembly (HGA) fabrication. The light sensitive sensor could be, for example, a photodiode or a photoconductor or another type of photodetector. For different HAMR slider designs there are a number of potential places where a light sensitive sensor could be fabricated, including but not limited to the locations shown in 4 and 5.

Figure 4:
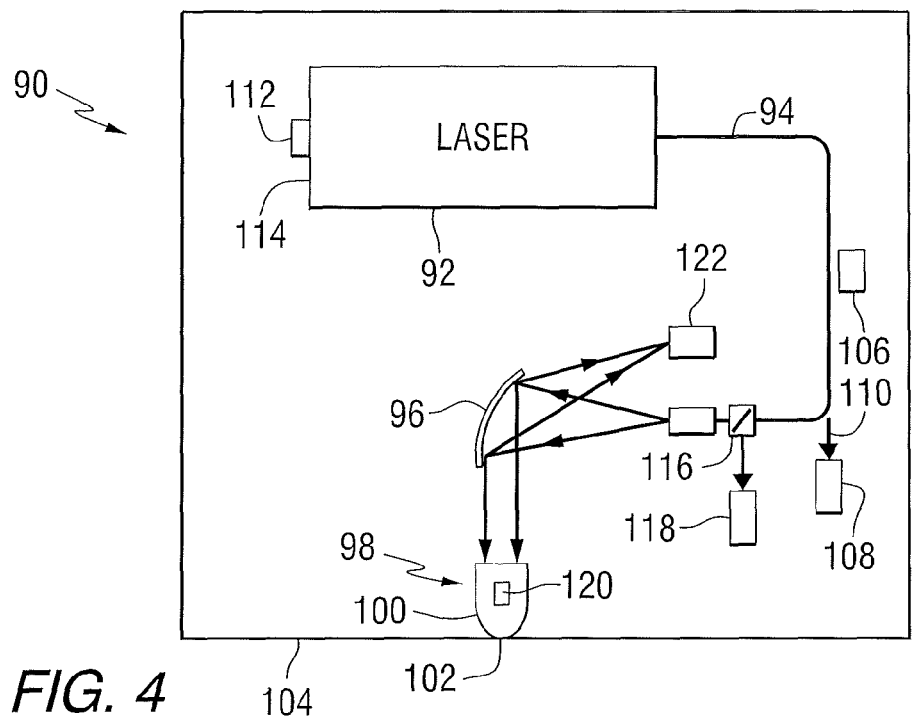
FIG. 4 is a schematic representation of portions of a slider showing possible locations of a light sensor.

FIG. 4 is a schematic representation of portions of another slider 90, which shows various possible locations for the sensor. The slider includes a laser 92, a channel waveguide 94, a reflector 96 and a recording head 98 including a planar solid immersion mirror 100 that concentrates the light to a point 102 adjacent to an air bearing surface 104. A silicon semiconductor 106 photodiode could be bonded to the surface of the waveguide to sense the scattered radiation or a photoconductive device 108 could be fabricated below the bend to detect light that leaks out of the waveguide, as illustrated by arrow 110. The amount of scattering or loss from the bend can be controlled during device fabrication by changing the material properties or device processing.

A light sensitive sensor 112 could be positioned to capture the rear facet emission from the back 114 of the laser cavity. For example, the light coming out of the back of the laser could hit the sensor. Alternatively, a splitter grating, mirror, or waveguide splitter 116 could be used to direct a small portion of the light to a photosensor 118. In another example the photosensor 120 could be mounted in or on the planar solid immersion mirror 100. In another example, the mirror or collimator 96 could be constructed to reflect a portion of the light to a light sensor 122.

Each light sensor in FIG. 4 would be electrically connected to a controller, as shown in FIG. 3. The controller would then use the measured sensor characteristic to control the laser power. For each of the sensor locations, the sensor detects a portion of the light before the light exits the slider at the air bearing surface 104. The sensed portion of light is light that is not used to heat the surface of the recording medium.

In one embodiment, the disclosure provides an integrated device with a laser, waveguide, and sensor on or in a single slider element. The desired laser power can be set by the controller based on magnetic readback signal properties from a magnetic read sensor. For example, recording performance can be measured using the figures of merit described above.

Then the laser power that provides a predetermined recording performance can be determined and set as the desired laser power.

Figure 5:
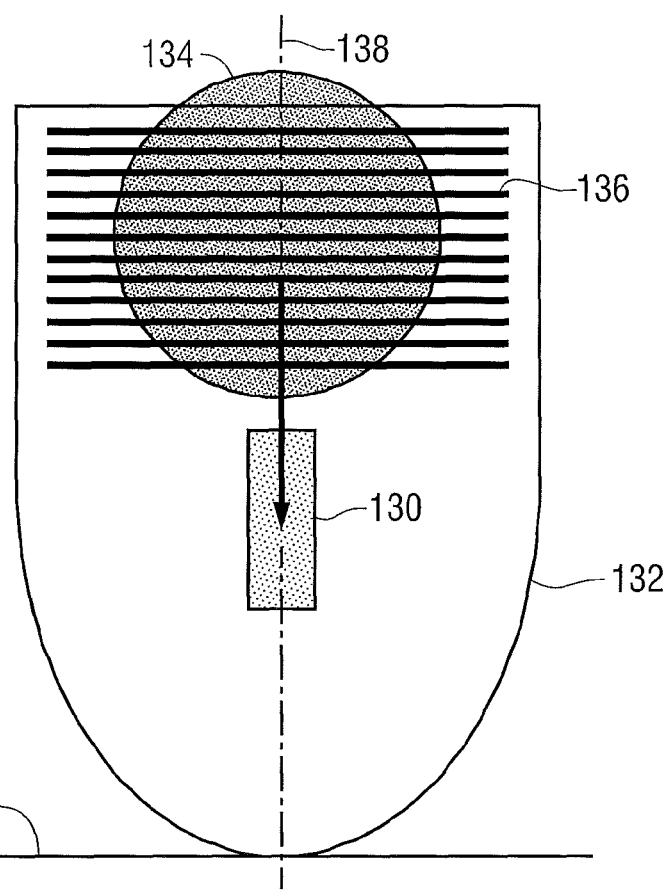
FIG. 5 is a schematic representation of a solid immersion mirror.

FIG. 5 is a more detailed drawing of another photosensor 130 adjacent to or embedded in a planar solid immersion mirror (PSIM) 132. A spot of light, represented by circle 134, impinges on a grating coupler 136 to couple the light into the waveguide. The grating coupler could be a single grating as shown in FIG. 5, or a spilt grating with a gap between two grating portions along the central axis 138 of the PSIM. The sensor 130 can be positioned to detect the light in unused portion of the beam such as the tails of the intensity distribution or in the center of the PSIM. Again, a controller would be used to measure a change in the relevant sensor characteristic. In another example, reflected light from the air bearing surface 142 could be used to change the sensor characteristic being monitored.

The photosensor can be for example a device that has a resistivity that changes in response to light or a device that produces a voltage in response to light. In various embodiments the photosensor can be, for example, a semiconductor or Pt thin film light intensity sensor, or a solar cell, which can be, for example, an amorphous silicon solar cell or an amorphous SiGe solar cell. Well-known examples of photoconductive materials are polymer polyvinylcarbazole, lead sulfide and selenium. Photoresistors come in many different types. Inexpensive cadmium sulfide cells can be found in many consumer items such as camera light meters, street lights, clock radios, alarms, and outdoor clocks. Amorphous silicon germanium is another photodetector option.

From the preceding description, it can be seen that in one aspect the disclosure provides a method including: using a light source to produce light that is directed to a waveguide in a slider, using a sensor to produce a signal representative of a portion of the light from the light source prior to the light exiting an air bearing surface of the slider, and controlling the light source power in response to the signal.

A magnetic sensor can be used to measure recording quality of recorded information on a storage disc; and the light source power can be controlled to optimize the recording quality. The light source power can be reduced when the storage device is in non-writing condition. Aging of the light source can be monitored to determine if the drive should be reoptimized or if a likely drive write failure should be reported.

In general a portion of the light not used to heat the media is detected or monitored using a photodetector which converts the optical energy directly into an electrical signal representative of a change in resistance, current or voltage. The sensor could be fabricated during the head wafer processing. For example, a photo diode could be bonded to the slider at wafer, bar, or slider fabrication. The sensor can have 1 or 2 electrical leads on a head flex circuit in a disc drive.

The sensor can be used to detect laser aging to allow appropriate backup/service action. An initial calibration of the laser power versus the monitored signal could be performed during a head gimbal assembly (HGA) test and stored for the HGA in the drive.

In another aspect, the disclosure provides a slider including a laser, a waveguide configured to receive light from the laser, a photosensor, and magnetic sensor; and a controller for controlling the laser in response to a magnetic readback signal from the magnetic sensor and a characteristic of the photosensor. The photosensor can detect light reflected from a storage medium.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
   a slider comprising:
      an air bearing surface; and
      a waveguide configured to receive light from a light source and emit the light from the slider at the air bearing surface;
   a sensor formed on the waveguide to receive a portion of the light leaked directly from the waveguide prior to the light exiting the slider at the air bearing surface;
   wherein the sensor is formed on a continuous portion of the waveguide, the continuous portion of the waveguide extending at least from the position of the sensor to where light is emitted from the slider at the air bearing surface during use; and
   a controller to adjust power of the light source in response to a characteristic of the portion of the light received by the sensor.

2. The apparatus of claim 1, wherein the sensor is positioned to receive light that leaks out of the waveguide.

3. The apparatus of claim 1, further comprising:
   a splitter positioned to direct the portion of light to the sensor.

4. The apparatus of claim 1, wherein the waveguide includes a bend, and the sensor is positioned adjacent to the bend.

5. The apparatus of claim 1, wherein the sensor comprises:
   a photovoltaic cell or a photoconductive element.

6. The apparatus of claim 1, further comprising:
   a solid immersion mirror configured to receive light from the light source, wherein the sensor is positioned adjacent to or in the solid immersion mirror.

7. The apparatus of claim 1, wherein the sensor detects light reflected from the air bearing surface.

8. The apparatus of claim 1, further comprising:
   a solid immersion mirror configured to receive light from the light source, wherein the sensor is positioned to detect a portion of the light in a central portion of the solid immersion mirror.

9. The apparatus of claim 1, wherein the characteristic of the sensor comprises one or more of: resistance, current and voltage.

10. The apparatus of claim 9, further comprising:
    a memory for storing the resistance, current or voltage.

11. The apparatus of claim 1, wherein the sensor comprises:
    a photovoltaic element or a photoconductive element.

12. The apparatus of claim 1, wherein the sensor is bonded to a surface of the waveguide.

13. The apparatus of claim 1, wherein the sensor is fabricated to detect light leaking from a bend in the waveguide.

14. The apparatus of claim 1, further comprising a collimator is constructed to reflect the portion of the light to the sensor.

15. The apparatus of claim 1, further comprising a grating to direct the portion of the light to the sensor.

16. A method comprising:
producing a light from a light source;
directing the light to a waveguide in a slider;
producing a signal representative of a portion of the light leaking from the waveguide directly onto a sensor formed on the waveguide prior to the light exiting an air bearing surface of the slider via the waveguide, wherein the sensor is formed on a continuous portion of the waveguide, the continuous portion of the waveguide extending at least from the position of the sensor to where light is emitted from the slider at the air bearing surface during use; and
controlling the light source power in response to the signal.

17. The method of claim 16, wherein the portion of the light leaks out of a bend in the waveguide.

18. The method of claim 16, further comprising:
using a magnetic sensor to measure recording quality of recorded information on a storage disc; and
controlling the light source power to optimize the recording quality.

19. The method of claim 16, wherein the light source power is reduced in a non-writing condition.

20. The method of claim 16, further comprising:
monitoring light source aging.

21. An apparatus comprising:
a slider comprising:
a laser;
a waveguide configured to receive light from the laser and to emit the light at an air bearing surface of the slider;
a photosensor formed on the waveguide to receive a portion of light directly leaked from the waveguide, wherein the photosensor is formed on a continuous portion of the waveguide, the continuous portion of the waveguide extending at least from the position of the photosensor to where light is emitted from the slider at the air bearing surface during use; and
a magnetic sensor; and
the apparatus further comprising a controller to adjust output of the laser in response to a magnetic readback signal from the magnetic sensor and a characteristic of the portion of the light leaked directly from the waveguide and received by the photosensor.

22. The apparatus of claim 21, wherein the photosensor detects light reflected from a storage medium.

\* \* \* \* \*